United States Patent
Sullivan et al.

(10) Patent No.: US 9,472,490 B1
(45) Date of Patent: Oct. 18, 2016

(54) IC STRUCTURE WITH RECESSED SOLDER BUMP AREA AND METHODS OF FORMING SAME

(71) Applicant: GLOBALFOUNDRIES Inc., Grand Cayman (KY)

(72) Inventors: Timothy M. Sullivan, Essex, VT (US); Glen E. Richard, Burlington, VT (US); Stephen P. Ayotte, New Haven, VT (US); Timothy D. Sullivan, Underhill, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/824,409

(22) Filed: Aug. 12, 2015

(51) Int. Cl.
*H01L 23/00* (2006.01)
*H01L 23/48* (2006.01)
*H01L 21/768* (2006.01)

(52) U.S. Cl.
CPC ....... *H01L 23/481* (2013.01); *H01L 21/76898* (2013.01); *H01L 24/11* (2013.01); *H01L 24/13* (2013.01); *H01L 2224/13021* (2013.01)

(58) Field of Classification Search
CPC ....... H01L 24/11; H01L 24/12; H01L 24/16; H01L 24/73; H01L 21/2855; H01L 21/2885; H01L 21/481; H01L 21/486; H01L 21/762
See application file for complete search history.

(56) References Cited

U.S. PATENT DOCUMENTS

| | | | |
|---|---|---|---|
| 8,039,385 B1 | 10/2011 | West et al. | |
| 8,202,797 B2 | 6/2012 | Chi et al. | |
| 8,487,304 B2 | 7/2013 | Chey et al. | |
| 8,492,878 B2 | 7/2013 | Farooq et al. | |
| 8,580,616 B2 | 11/2013 | Nalla et al. | |
| 8,802,504 B1 | 8/2014 | Hou et al. | |
| 2009/0294983 A1* | 12/2009 | Cobbley | H01L 21/76898 257/774 |
| 2014/0077369 A1* | 3/2014 | Liang | H01L 23/49827 257/738 |
| 2014/0322909 A1 | 10/2014 | Chen et al. | |
| 2014/0329381 A1 | 11/2014 | Zhang et al. | |

* cited by examiner

*Primary Examiner* — Whitney T Moore
*Assistant Examiner* — Joseph Galvin, III
(74) *Attorney, Agent, or Firm* — Hoffman Warnick LLC; Anthony Canale

(57) ABSTRACT

Embodiments of the present disclosure provide an integrated circuit (IC) structure with a recessed solder bump area, and methods of forming the same. An IC structure according to embodiments of the present disclosure can include: a semiconductor material, wherein an upper surface of the semiconductor material includes a non-recessed area and a recessed area laterally separated from each other, the recessed area of the upper surface being shaped to receive a solder bump therein; at least one first through-semiconductor via (TSV) positioned within the semiconductor material and including an upper surface protruding from the recessed area of the semiconductor material; and a metal layer formed over the recessed area and electrically connected to the at least one first TSV.

17 Claims, 5 Drawing Sheets

US 9,472,490 B1

IC STRUCTURE WITH RECESSED SOLDER BUMP AREA AND METHODS OF FORMING SAME

FIELD OF THE INVENTION

The subject matter disclosed herein relates to integrated circuit (IC) structures and methods of forming the same. More specifically, aspects of the invention relate to IC structures with one or more recessed solder bump areas, and methods of forming the IC structures.

BACKGROUND

In flip chip processing of semiconductor integrated circuit (IC) chips, solder bumps such as controlled collapse chip connect (C4) solder balls can be implemented to connect IC dies to packaging. As IC designs have grown to incorporate more structures, the amount of current transmitted to components of an IC has also increased. For example, vias such as through-semiconductor vias (TSVs, also known as through-silicon vias) can transmit more than two amperes (A) to elements of an IC of current during operation. However, these improvements may be limited in some respects by the properties of other electrically connected components, particularly where the connected components are limited by other variables and/or design constraints. Conventional C4 solder bumps illustrate this situation, e.g., by having a maximum current carrying capacity of approximately 0.200 A. Electrically connecting multiple C4 solder bumps to a single TSV may partially alleviate this problem, but increase the surface area needed to provide an electrical connection to a single TSV.

BRIEF SUMMARY

A first aspect of the disclosure provides an integrated circuit (IC) structure including: a semiconductor material, wherein an upper surface of the semiconductor material includes a non-recessed area and a recessed area laterally separated from each other, the recessed area of the upper surface being shaped to receive a solder bump therein; at least one first through-semiconductor via (TSV) positioned within the semiconductor material and including an upper surface protruding from the recessed area of the semiconductor material; and a metal layer formed over the recessed area and electrically connected to the at least one first TSV.

A second aspect of the disclosure provides a method of forming an integrated circuit (IC) structure, the method including: forming a recess within a semiconductor material, the semiconductor material including at least one through-semiconductor via (TSV) positioned such that an upper surface of the at least one TSV protrudes from the recess; forming a metal layer over the recess and the upper surface of the at least one TSV; and forming a first solder bump over and in contact with the metal layer.

A third aspect of the disclosure provides an IC structure including: a first IC chip including a semiconductor material, wherein an upper surface of the semiconductor material includes a non-recessed area and a recessed area laterally separated from each other, the recessed area of the upper surface being shaped to receive a solder bump therein; a first through-semiconductor via (TSV) positioned within the first IC chip and including an upper surface which protrudes from the recessed area of the upper surface of the semiconductor material; a metal layer conformally contacting the recessed area and the first TSV; a first solder bump formed within the recessed area of the upper surface of the semiconductor material and contacting the metal layer, wherein the first TSV extends into the first solder bump; a solder bump pad positioned over a second TSV and the non-recessed area of the upper surface of the semiconductor material; and a second solder bump formed over the solder bump pad and the second TSV, wherein each of the first and second solder bumps electrically connect the first IC chip to one of a laminate assembly and a second IC chip.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Embodiments of the present disclosure provide an integrated circuit (IC) structure with a recessed solder bump area, and methods of forming the same. To provide greater current carrying capacity with a lower surface area for transmitting an electrical current, structures of the present disclosure include a body of semiconductor material having an upper surface with both a recessed area and a laterally separated non-recessed area. The recessed area can be shaped to receive a solder bump therein, particularly solder bumps with a larger volume than conventional C4 solder bump balls. The recessed area can be aligned with one or more through-semiconductor vias (TSVs, also known as through-silicon vias) positioned within the semiconductor material, such that the TSV(s) protrude from the recessed area of an upper surface of the semiconductor material. A metal layer, which can serve as a substitute for a conventional solder bump pad, may be formed over the recessed area and electrically connected to the TSV(s) therein. To illustrate inventive aspects of the IC structures discussed herein and methods of forming the same, steps of an example process for forming an IC structure are shown first in FIGS. 1-4 and discussed herein.

Figure 1:
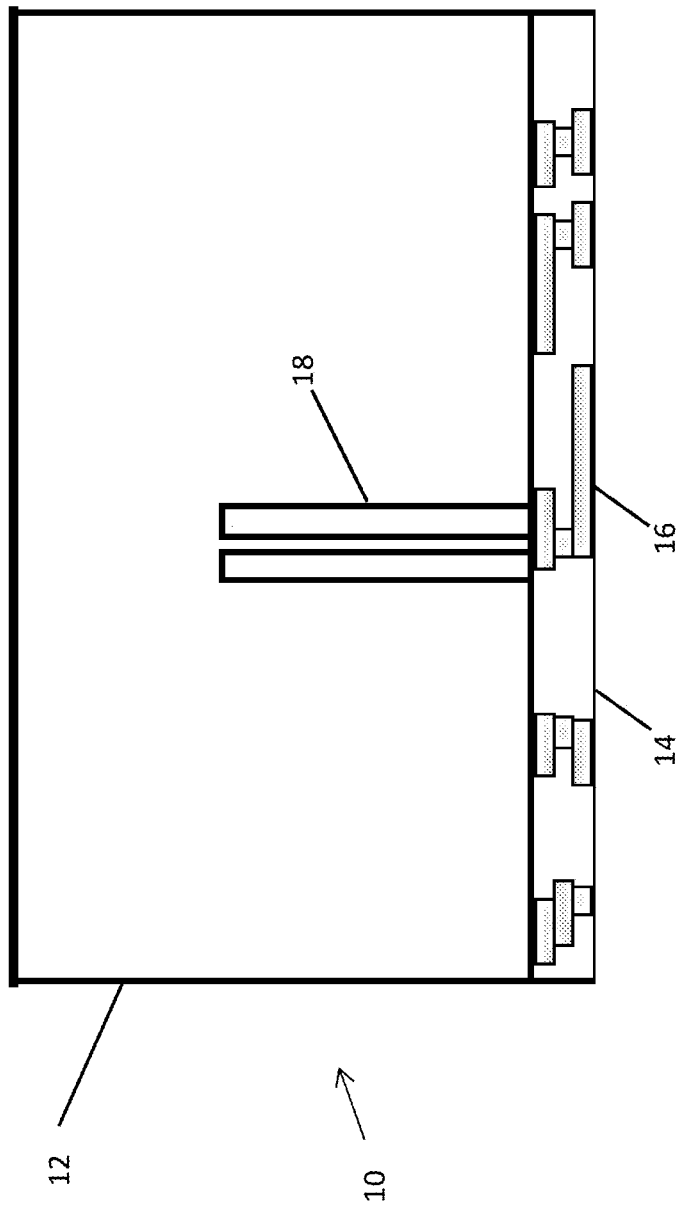
FIG. 1 shows an initial IC structure according to embodiments of the present disclosure.

Referring to FIG. 1, an initial structure 10 according to embodiments of the present disclosure is shown. Structure 10 can include a semiconductor material 12 composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of semiconductor material 12 or a portion thereof may be strained.

Semiconductor material 12 can be positioned over a region of insulator material 14, which can be subdivided into a group of layers providing different amounts of electrical insulation. For example, insulator material 14 may be composed of any insulating material such as SiO2 or a "high-k" dielectric having a high dielectric constant (where "k" denotes the material's dielectric constant), which may be, for example, above 3.9. In some situations, insulator material 14 may be composed of an oxide substance. Insulator 14 can initially be formed as a single, continuous layer or group of insulating layers, each of which can be separately processed to include trenches, cavities, etc. Materials appropriate for the composition of insulator material 14 may include, for example, silicon dioxide (SiO2), silicon nitride (SiN), hafnium oxide (HfO2), alumina (Al2O3), yttrium oxide (Y2O3), tantalum oxide (Ta2O5), titanium dioxide (TiO2), praseodymium oxide (Pr2O3), zirconium oxide (ZrO2), erbium oxide (ErOx), and other currently known or later developed materials having similar properties. As is known in the art, the properties of insulator material 14, including the magnitude of each layer's dielectric constant for each layer, can allow for different types of layers to serve as, e.g., a "high-k" layer, a "low-"k" layer, an "ultra low-k" layer, etc. Insulator material 14 can include a plurality of metal wires 16 therein for providing electrical connections between, e.g., IC structures discussed herein and other IC devices.

One or more through-semiconductor vias (TSVs, also known as through-silicon vias) 18 may be embedded within semiconductor material 12. As known in the art, a TSV may refer to an electrically conductive via etched through a substrate or semiconductor "wafer" to provide a wafer-to-wafer interconnect scheme compatible with 3D wafer-level packaging, e.g., electrical connections which use solder bumps formed on an upper surface of substrate or semiconductor material. Each TSV 18 can be used to connect metal wires 16 to other components powered by electric current. TSVs 18 can include substantially annular refractive liners (not shown) disposed circumferentially about their structure for providing additional electrical insulation and for preventing electromigration between TSV(s) 18 and adjacent structures. In a particular embodiment, one or more TSVs 18 within semiconductor material 12 can be embodied as a power supply TSV for transmitting larger amounts of current than other TSVs. One or more power supply TSVs can be fabricated in the form of, e.g., a substantially annular TSV, optionally including a semiconductor pillar positioned therein, and positioned substantially in parallel with an axial center of TSV 18. A power supply TSV can be sized to transmit more than, e.g., approximately two amperes (A) of current therethrough. In any event, TSVs 18 may be composed of electrically conductive metals such as copper, aluminum, tungsten, and silver. As is shown in FIG. 1, each TSV can extend substantially vertically through semiconductor material 12 between two axial ends, one of which may be positioned below upper surface 20 of semiconductor material 12. As used herein, the term "substantial" or "substantially" in relation to a specified spatial relationship, quantifiable in terms of units such as distance, displacement, conductivity, etc., can include two or more values within ten percentage points (i.e., above or below) of each other and/or a specified numerical value or percentage, and/or all variances in placement which cause no substantial operational difference between the stated spatial relationship (e.g., vertical or horizontal alignment, parallel or perpendicular orientation) and the practiced spatial relationship. The terms "substantial" or "substantially" can also include other specific types of spatial relationships or ranges of spatial relationships where specified herein.

Figure 2:
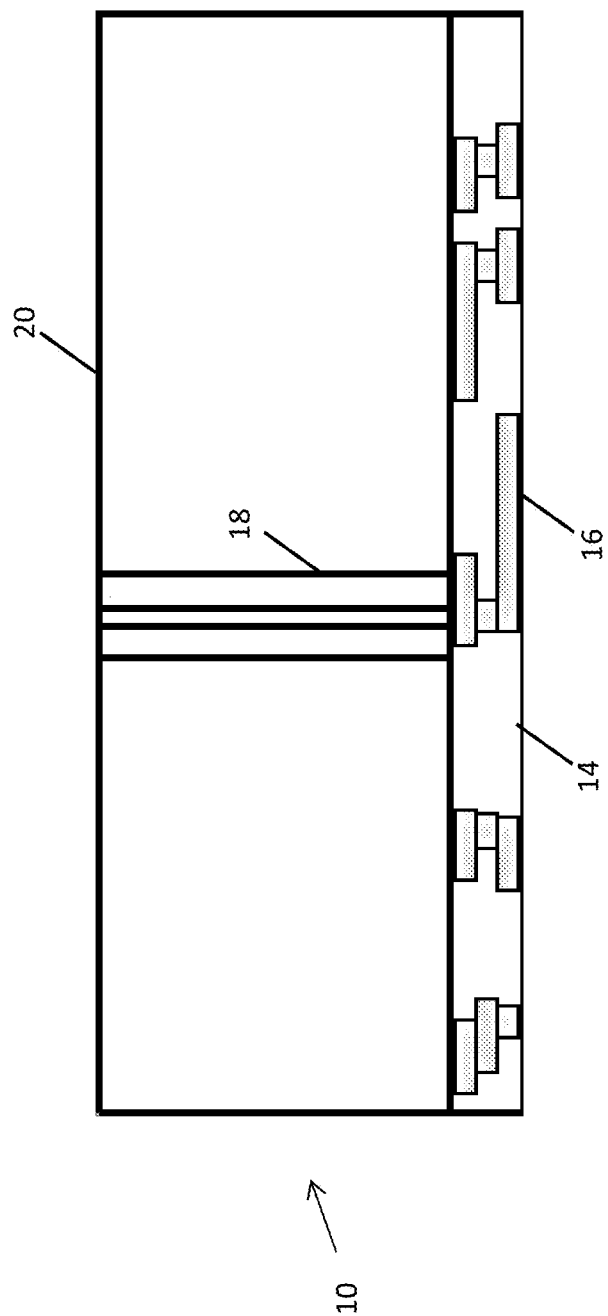
FIG. 2 shows a planarized IC structure during processing according to embodiments of the present disclosure.

In an embodiment, as shown in FIG. 2, semiconductor material 12 can be planarized to form upper surface 20, coplanar with the upper axial end of with TSV(s) 18, by various material removal or polishing techniques now known or later developed, e.g., CMP or other forms of polishing. As used herein, "CMP" or "chemical-mechanical polishing" refers to a method of removing layers of solid material by chemical-mechanical polishing carried out for the purpose of surface planarization, as is done in back-end of line (BEOL) IC manufacturing. In addition, "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface. Providing or forming upper surface 20 coplanar with an upper axial end of TSV(s) 18 can allow further processing of semiconductor material 12, e.g., forming recesses therein, to retain the shared planarity between the upper axial end of TSV(s) 18 and non-recessed areas of upper surface 20.

Figure 3:
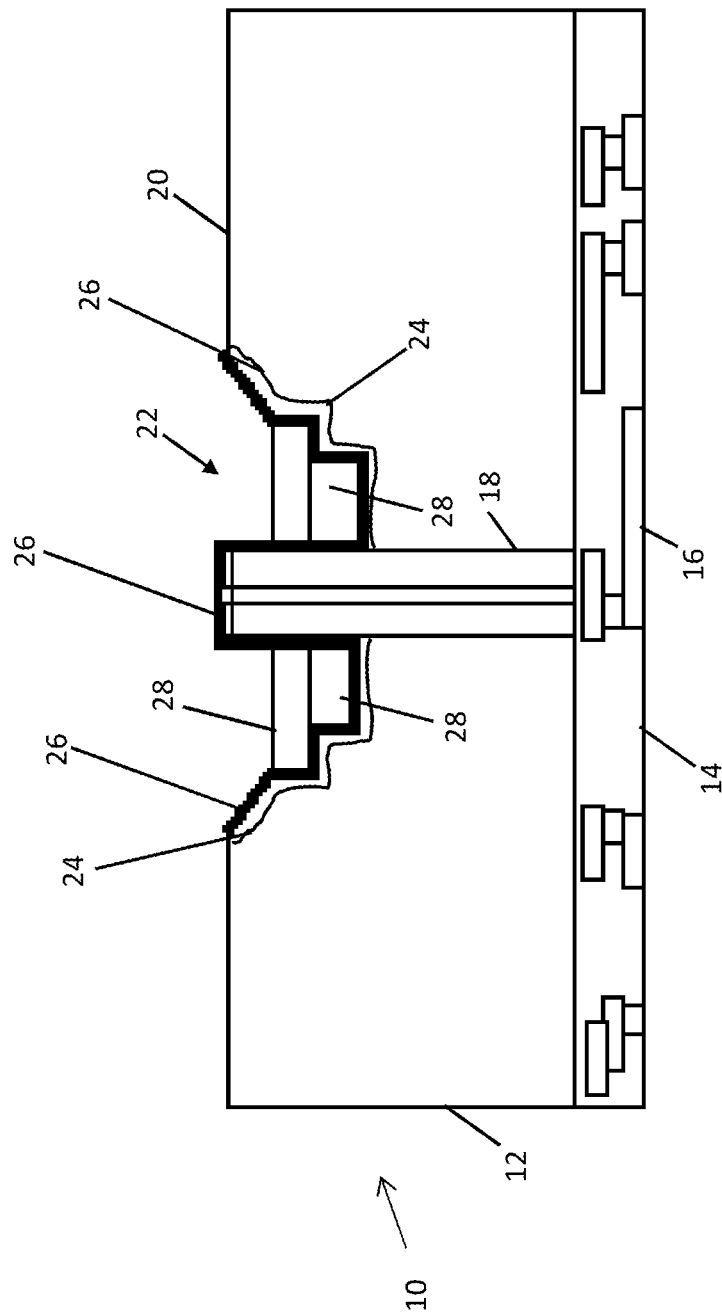
FIG. 3 shows a recessed IC structure during processing according to embodiments of the present disclosure.

Turning to FIG. 3, a process of forming a recess 22 within semiconductor material 12 with TSV 18 therein is shown. Recess 22 can be formed within semiconductor material 12 by any currently known or later-developed process for selectively removing a material or portions thereof from a larger structure, including depositing a photoresist, patterning, and wet and/or dry etching. For example, methods according to the present disclosure can include applying a selective etchant, e.g., a silicon-selective etchant such as a solution of hydrogen fluoride (HF) and water, to semiconductor material 12 in order to remove substances not covered by a mask. As is shown in FIG. 3, TSV 18 can remain substantially intact after the forming of recess 22, such that an upper axial end of one or more TSVs 18 protrudes from recess 22 and remains substantially coplanar with upper surface 20 of semiconductor material 12. The size of recess 22 can be selected and controlled, e.g., by adjusting the amounts of patterning, etchant and/or active materials used, based on user and/or design specifications. For example, etching recess 22 with greater depth about TSV(s) 18 can increase the surface area over which current transmitted from TSV(s) 18 can spread. Increasing the depth of recess 22 can also provide, e.g., more contact area and substantially flat surfaces for supplemental metal layers of varying thickness (discussed elsewhere herein) to be formed. The size of recess 22 can also be adjusted such that solder bumps therein can be formed to a desired size, shape, volume, etc.

To increase the quality of an electrical connection between TSVs 18, methods according to the present disclosure can optionally include forming a conductive liner 24 over recess 22 and TSV 18. Conductive liner 24 can be composed of any currently known or later developed conductive material, e.g., refractory metals such as ruthenium (Ru), tantalum (Ta), titanium (Ti), tungsten (W), iridium (Ir), rhodium (Rh) and platinum (Pt), etc., or mixtures of thereof.

Conductive liner 24 can be formed pursuant to any currently known or later developed process of forming a material, such as deposition. As used herein, "deposition" or "depositing" a material (e.g., conductive liner 24) may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed.

To provide increased conductivity between TSV 18 and electrical components formed thereon, and/or increased surface area of contact between components, embodiments of the present disclosure can include forming a metal layer 26 on semiconductor structure 12, TSV(s) 18, and/or conductive liner 24 (where applicable). Metal layer 26 can be formed by any currently known or later developed process of forming a conductive material, including the deposition processes described elsewhere herein. In addition to metal layer 26, embodiments of the present disclosure can optionally include forming supplemental metal layers 28 on metal layer 26 to, e.g., further increase conductivity between TSV 18 and solder bumps formed thereon, provide a desired contact area shape or size, etc. Supplemental metal layers 28 can be formed in substantially the same manner as metal layer 26, e.g., during the same process as forming metal layer 26 or in a different, subsequent process. During operation, metal layer 26 and/or supplemental metal layers 28 can serve as ball-limiting metallurgy (BLM) layers for limiting the size of solder bumps formed on TSV(s) 18 of structure 10. Specifically, BLM materials refer to solder-wettable metals which define the size and area of a soldered connection, e.g., between C4 solder bumps and a chip. BLM metals can include, e.g., one or more of the refractory metals discussed herein. BLM metals can limit the flow of a formed solder bump to the area covered by BLM metal, thereby providing adhesion and contact to the formed wiring.

Figure 4:
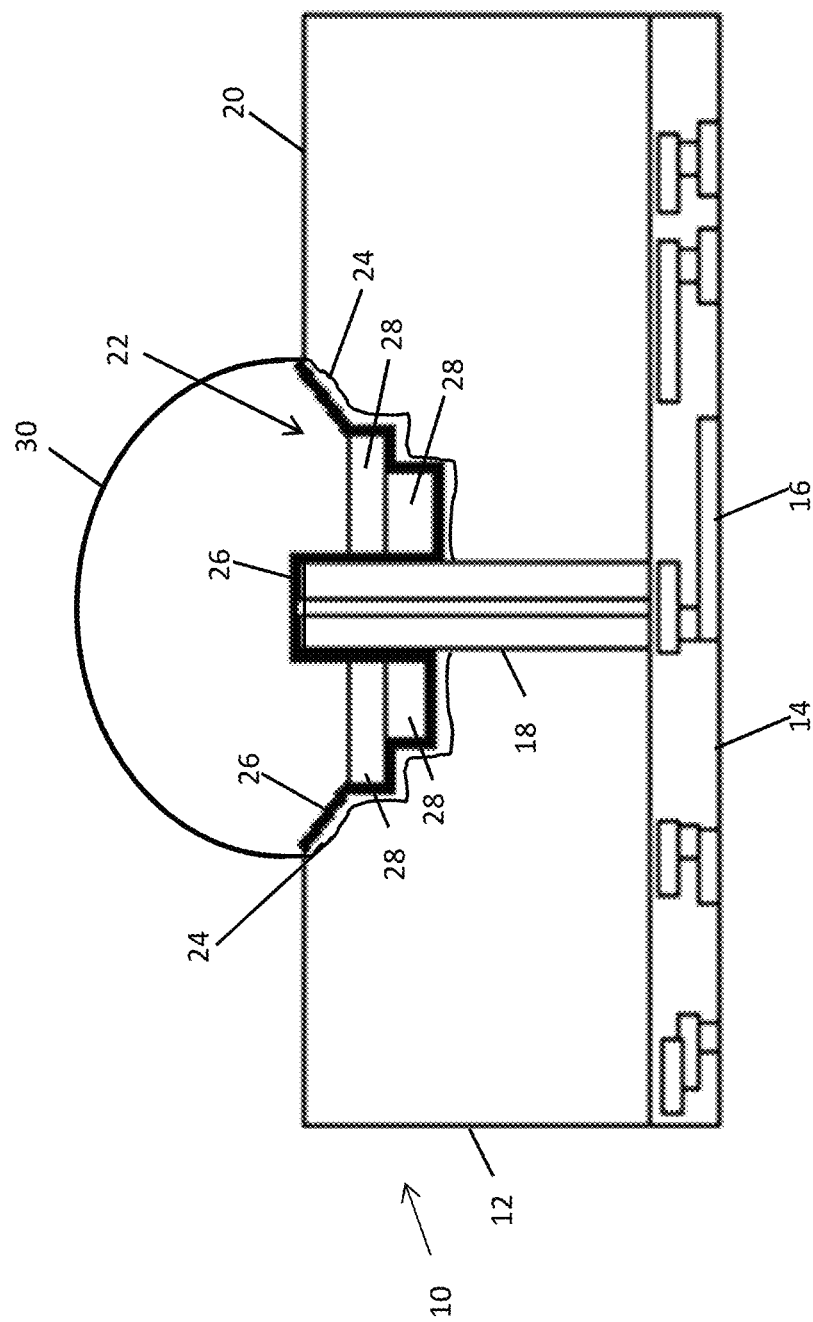
FIG. 4 shows a recessed IC structure and solder bump according to embodiments of the present disclosure.

Turning to FIG. 4, embodiments of the present disclosure include processes of forming a first solder bump 30 over and in contact with metal layer 26 and/or supplemental metal layers 28, thereby forming an electrical connection between TSV(s) 18 and other structures through first solder bump 30. First solder bump 30 can be composed of any currently known or later developed solderable material that can include, without limitation, material having tin and lead, tin without lead, tin with a residual of copper or silver, tin bismuth, tin indium, etc. The size of first solder bump 30 can be determined at least in part by the size (e.g., surface area, depth, etc.) of recess 22 formed within semiconductor material 12. It is therefore understood that embodiments of the present disclosure provide processes of forming variable-sized first solder bumps 30 within variable-sized recesses 22. For example, where multiple recesses 22 are formed within semiconductor material 12 and with different sizes, each first solder bump 30 can similarly be of a different size to accommodate varying current carrying capacity and/or spacing requirements of a resulting IC structure.

Figure 5:
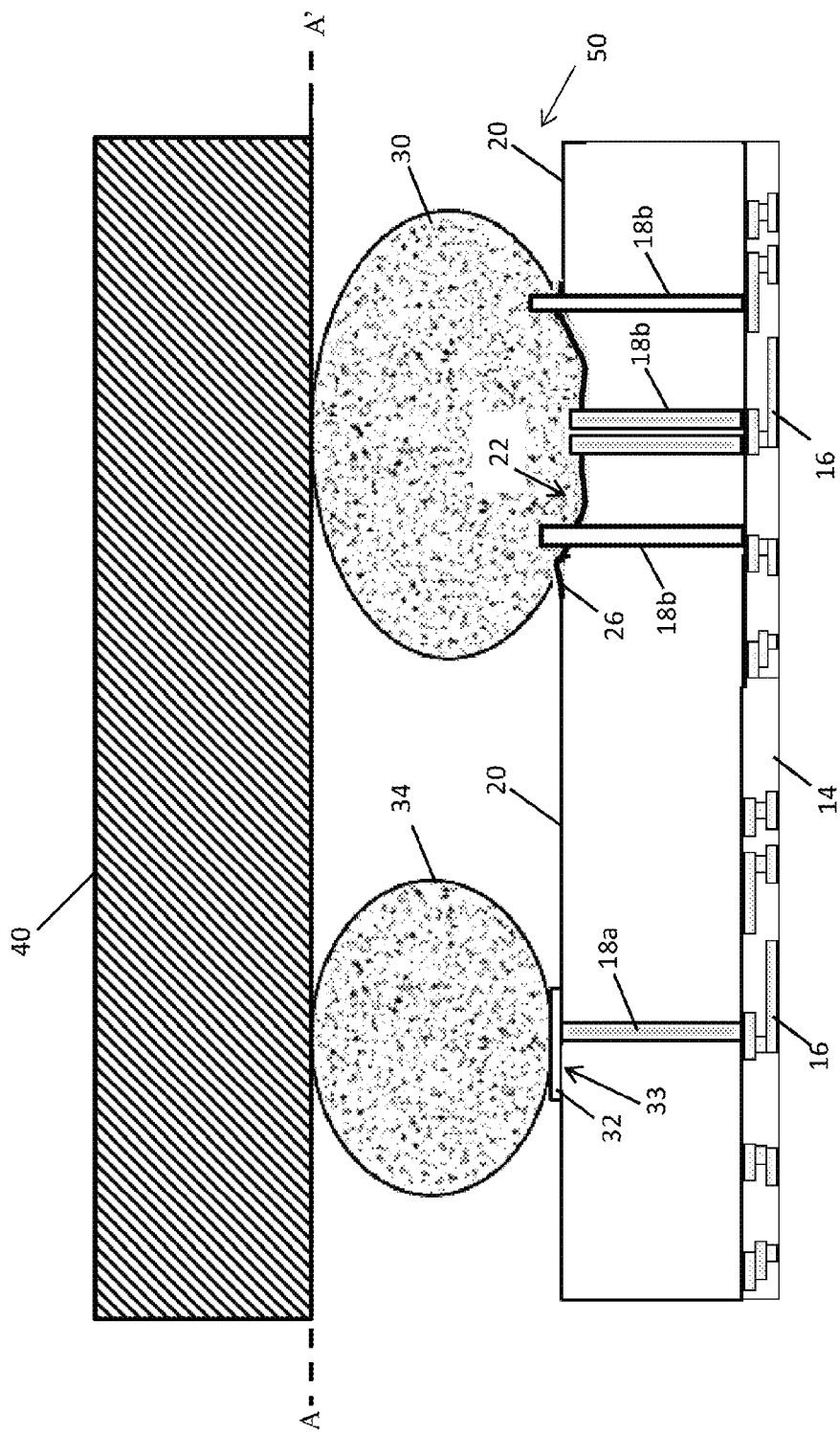
FIG. 5 shows a recessed IC structure with two laterally separated solder bumps according to embodiments of the present disclosure.

Referring now to FIG. 5, additional processes of forming an IC structure according to embodiments of the present disclosure are shown. Although the forming of recess 22 substantially over TSVs 18 (FIGS. 1-4) for variable sized first solder bumps 30 is discussed herein, embodiments of the present disclosure can also include forming other types of solder bumps in the same IC structure. FIG. 5 illustrates TSV(s) 18a underneath a different area of upper surface 20 of semiconductor material 12 and TSV(s) 18b substantially underneath recess 22. For example, further processing steps can include forming a solder bump pad 32 over a laterally separated area of upper surface 20 of semiconductor material 12. Solder bump pad 32 can be composed of a conductive material, such as a metal or combination of metals, and can be formed, e.g., by any currently known or later developed deposition process. Solder bump pad 32 can be formed over TSV 18a positioned within a non-recessed area 33 of semiconductor material 12 connected to one or more metal wires 16. Subsequently, a second solder bump 34 can be formed over and in contact with solder bump pad 32. As is shown in FIG. 5, second solder bump 34 formed over solder bump pad 32 can have a smaller volume, radius, surface area, etc. than first solder bump 30. Nevertheless, an upper surface of second solder bump 34 can be substantially coplanar (e.g., along line A-A' in FIG. 5) with first solder bump 30. The substantially shared planarity between upper surfaces of first solder bump 30 and second solder bump 34 can be derived from, e.g., the presence of recess 22 beneath first solder bump 30 and the absence of recesses 22 beneath second solder bump 34. As a result, a laminate circuit assembly 40 (comprising, e.g., a distinct conductive connection, separate electrical circuit, separate IC chip, etc.) can be formed over and in contact with first solder bump(s) 30 and, optionally, second solder bump(s) 32 regardless of any sizing differences between each bump.

FIG. 5 illustrates an IC structure 50 according to embodiments of the present disclosure, capable of being formed according to the example process steps described herein. IC structure 50 can include, e.g., semiconductor material 12 with upper surface 20 free of recesses therein, and one or more recesses 22 laterally separated from non-recessed area(s) 33 of upper surface 20. Recess 22, as shown in FIG. 5, can be shaped to receive first solder bump 30 therein. At least one TSV 18b can be positioned and substantially vertically oriented within semiconductor material 12, such that an upper axial end of TSV(s) 18b extends into and/or through recess 22. For example, In FIG. 5, some TSVs 18b is shown in the form of a substantially cylindrical TSV structure, while another TSV 18b is shown in the form of a substantially annularly shaped TSV for use, e.g., as a power supply TSV or other TSV with an increased current-carrying capacity. A metal layer 26, acting as an electrical connection between TSV(s) 18b and first solder bump 30, can be formed conformally over the surface of recess 22 and/or TSV(s) 18b. As discussed elsewhere herein, conductive liner 24 (FIGS. 3-4) can also be formed between recess 22 and metal layer 26, but is omitted from FIG. 5 for clarity. As is discussed elsewhere herein, metal layer 26 can serve as a ball-limiting metallurgy layer (BLM) during fabrication and/or operation of IC structure 50. Metal layer 26 can provide greater electrical conductivity and/or an increased contact area between TSV(s) 18b. IC structure 50 can also, optionally, include supplemental metal layers 28 such as those shown in FIG. 4 and described elsewhere herein.

IC structure 50 can be embodied as semiconductor material 12 with recess 22, one or more TSV(s) 18a, 18b, and metal layer 26 without first solder bump 30 thereon. Alternatively, IC structure 50 can include first solder bump 30 positioned within recess 22. First solder bump 30 can thereby electrically connect TSV(s) 18b to laminate circuit assembly 40. Where TSV(s) 18b extend from semiconductor material 12 into recess 22, first solder bump 30 can be formed at least partially conformally over TSV(s) 18b, such that one or more TSV(s) 18b extend into first solder bump 30. It is understood that all some, or none of TSV(s) 18b can extend into first solder bump 30 where desired and/or applicable. Embodiments where TSV(s) 18b extend into first solder bump 30 can provide benefits such as, e.g., improved electrical performance, lower electromigration decay, etc., at the interface between TSV(s) 18b and first solder bump 30.

IC structure 50 can also include one or more second solder bumps 34, formed over non-recessed area(s) 33 of upper surface 20 of semiconductor material 12, and laterally separated from first solder bump(s) 30. The absence of recess 22 within semiconductor material 12 beneath second solder bump(s) 34 can allow first solder bump 30 to have a larger volume, radius, surface area, etc., than second solder bump 34 while including an upper surface which is substantially coplanar (e.g., along line A-A') with an upper surface of second solder bump 34. Recess 22 being positioned beneath first solder bump 30 can also create a larger contact area between first solder bump 30 and its corresponding TSV(s) 18b through metal layer 26 than is present between second solder bump 34 and its corresponding TSV 18a through solder bump pad 32.

Embodiments of the present disclosure can provide multiple technical and commercial advantages, some of which are discussed by way of example herein. One technical benefit to the structures and processes described herein is the ability to form and use solder bumps of varying size for chip-to-chip, chip-to-packaging, and/or other types of electrical connections. The use of variably sized solder bumps can provide, e.g., an ability to form solder bumps for transmitting larger amounts of electrical current as compared to conventional structures, including currents of at least approximately two amperes from particular TSVs. The use of variable sized solder bumps can also provide for increased contact surface area between TSVs and a corresponding solder bump, while reducing the total amount of area required for solder bump connections, and maintaining a substantially planar upper surface across each solder bump.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. An integrated circuit (IC) structure comprising:
   a semiconductor material, wherein an upper surface of the semiconductor material includes a non-recessed area and a recessed area laterally separated from each other, the recessed area of the upper surface being shaped to receive a solder bump therein;
   at least one first through-semiconductor via (TSV) positioned within the semiconductor material and including an upper surface protruding from the recessed area of the semiconductor material;
   a metal layer formed over the recessed area and electrically connected to the at least one first TSV;
   a first solder bump formed within the recessed area and contacting the metal layer, wherein the at least one first TSV extends into the first solder bump; and
   a second solder bump formed over the non-recessed area of the upper surface of the semiconductor material.

2. The IC structure of claim 1, further comprising a conductive liner positioned between the metal layer and the recessed area of the upper surface.

3. The IC structure of claim 1, wherein the at least one first TSV comprises a plurality of first TSVs each extending into and electrically connected to the first solder bump.

4. The IC structure of claim 1, wherein the first solder bump electrically connects the at least one first TSV to a laminate circuit assembly.

5. The IC structure of claim 1, wherein a volume of the first solder bump is larger than a volume of the second solder bump, and wherein an upper surface of the first solder bump is substantially coplanar with an upper surface of the second solder bump.

6. The IC structure of claim 1, wherein a contact area between the at least one first TSV and the first solder bump is greater than a contact area between the second solder bump and a second TSV, the second TSV being laterally distal to the first TSV.

7. The IC structure of claim 1, wherein the metal layer comprises a ball-limiting metallurgy (BLM) layer.

8. The IC structure of claim 1, wherein the at least one first TSV includes a power supply TSV.

9. A method of forming an integrated circuit (IC) structure, the method comprising:
   forming a recess within a semiconductor material, the semiconductor material including at least one through-semiconductor via (TSV) positioned such that an upper surface of the at least one TSV protrudes from the recess;
   forming a metal layer over the recess and the upper surface of the at least one TSV;
   forming a first solder bump over and in contact with the metal layer; and
   forming a second solder bump over a non-recessed upper surface of the semiconductor material and substantially coplanar with the first solder bump laterally separated therefrom.

10. The method of claim 9, further comprising planarzing the semiconductor material, before the forming of the recess, to yield an upper surface of the semiconductor material substantially coplanar with the upper surface of the at least one TSV.

11. The method of claim 9, wherein the forming of the recess includes applying a silicon-selective etchant to the semiconductor material.

12. The method of claim 9, wherein the metal layer comprises a ball-limiting metallurgy (BLM) layer.

13. The method of claim 12, further comprising forming a conductive liner over the recess and the upper surface of the TSV before the forming of the metal layer.

14. The method of claim 9, wherein the at least one TSV includes a power supply TSV of the semiconductor material.

15. The method of claim 9, further comprising:
 forming a solder bump pad over a non-recessed area of the semiconductor material, the non-recessed area of the semiconductor material being laterally separated from the recess; and
 forming a second solder bump over and in contact with the solder bump pad, wherein a volume of the first solder bump pad is larger than a volume of the second solder bump.

16. An integrated circuit (IC) structure comprising:
 a first IC chip including a semiconductor material, wherein an upper surface of the semiconductor material includes a non-recessed area and a recessed area laterally separated from each other, the recessed area of the upper surface being shaped to receive a solder bump therein;
 a first through-semiconductor via (TSV) positioned within the first IC chip and including an upper surface which protrudes from the recessed area of the upper surface of the semiconductor material;
 a metal layer conformally contacting the recessed area and the first TSV;
 a first solder bump formed within the recessed area of the upper surface of the semiconductor material and contacting the metal layer, wherein the first TSV extends into the first solder bump;
 a solder bump pad positioned over a second TSV and the non-recessed area of the upper surface of the semiconductor material; and
 a second solder bump formed over the solder bump pad and the second TSV, wherein each of the first and second solder bumps electrically connect the first IC chip to a laminate circuit assembly.

17. The IC structure of claim 16, wherein the at least one first TSV includes a substantially annular power supply TSV of the first IC chip.

* * * * *